US007893422B2

United States Patent
Tavkhelidze

(10) Patent No.: US 7,893,422 B2
(45) Date of Patent: Feb. 22, 2011

(54) TRANSISTOR ON THE BASIS OF NEW QUANTUM INTERFERENCE EFFECT

(75) Inventor: Avto Tavkhelidze, Tbilisi (GE)

(73) Assignee: Borealis Technical Limited (GI)

(*) Notice: Subject to any disclaimer, the term of this patent is extended or adjusted under 35 U.S.C. 154(b) by 151 days.

(21) Appl. No.: 12/075,943

(22) Filed: Mar. 13, 2008

(65) Prior Publication Data

US 2008/0224124 A1    Sep. 18, 2008

Related U.S. Application Data

(63) Continuation-in-part of application No. 11/901,549, filed on Sep. 18, 2007, now Pat. No. 7,566,897.

(30) Foreign Application Priority Data

Mar. 13, 2007    (GB) .................................. 0704784.8

(51) Int. Cl.
*H01L 29/06* (2006.01)
(52) U.S. Cl. ............................................ 257/9; 257/14
(58) Field of Classification Search ...................... 257/9, 257/14
See application file for complete search history.

(56) References Cited

U.S. PATENT DOCUMENTS

| 4,888,622 | A | * | 12/1989 | Ishibashi et al. | ............... | 257/31 |
| 5,497,015 | A | * | 3/1996 | Ishibashi et al. | ............ | 257/287 |
| 5,682,041 | A | * | 10/1997 | Kawakubo et al. | ............ | 257/38 |
| 7,166,786 | B2 | * | 1/2007 | Tavkhelidze et al. | .......... | 216/54 |

* cited by examiner

*Primary Examiner*—Douglas M Menz

(57) ABSTRACT

A quantum interference transistor comprising a thin metal film having a protrusion and a thin insulating layer between the metal film and protrusion. A potential barrier is formed in the region beneath the protrusion as a result of quantum interference caused by the geometry of the film and protrusion. A voltage applied between the electrically isolated protrusion ("island") and the thin film leads to a change in the electron wave function of the island which in turn leads to a change in the Fermi level of the metal film in the entire region beneath the protrusion. Consequently, a potential barrier may or may not exist depending on the applied voltage, thus providing the present invention with the transistor-like property of switching between open and closed states.

12 Claims, 1 Drawing Sheet

TRANSISTOR ON THE BASIS OF NEW QUANTUM INTERFERENCE EFFECT

CROSS-REFERENCE TO RELATED APPLICATIONS

This application claims the benefit of U.K. Patent Application No. GB0704784.8, filed Mar. 13, 2007. This application is also a Continuation-in-Part of U.S. patent application Ser. No. 11/901,549, filed Sep. 18, 2007, now U.S. Pat. No. 7,566,897 claims the benefit of U.K. Patent Application No. GB0618268.7, filed Sep. 18, 2006. The above-mentioned documents are incorporated herein by reference in their entirety.

BACKGROUND OF THE INVENTION

This invention relates to quantum interference transistors.

U.S. Pat. No. 4,888,622 discloses a superconducting electron device in which a pair of parallel superconducting channels each having a Josephson junction therein are provided between source and drain electrodes. A gate electrode is provided to apply a voltage to the channels to make potentials at each of the channels different to each other. The current flow through the channels is controlled by the application of a voltage to the gate electrode based on electrostatic Aharonov-Bohm effect. The device uses the coherency characteristics of the superconducting material, thus high speed switching operation can be achieved.

In recent years, much research has been directed towards the development of quantum transistors. Forms that have been proposed include the Aharonov-Bohm quantum phase transistor, quantum well transistor, quantum-tunneling transistor, and quantum diffraction transistor. It is an object of the present invention to provide a novel transistor based on a new quantum interference effect.

U.S. Pat. Nos. 6,281,514, 6,495,843, and 6,531,703 disclose methods for promoting the passage of electrons at or through a potential barrier comprising providing a potential barrier having a geometrical shape for causing quantum interference of electron de Broglie wave. Also provided is an electron-emitting surface having a series of indents, the depth of which is chosen so that the probability wave of the electron reflected from the bottom of the indent interferes destructively with the probability wave of the electron reflected from the surface (A. Tavkhelidze et. al., *J. Vac. Sci. Technol.* B, v. 24, p. 1413, 2006). This results in the increase of tunneling through the potential barrier. A further embodiment provides a method for making an electron-emitting surface having a series of indents.

U.S. Pat. No. 6,680,214 and U.S. Patent. App. Pub. No. 2004/0206881 disclose methods for the induction of a suitable band gap and electron emissive properties into a substance, in which the substrate is provided with a surface structure corresponding to the interference of de Broglie waves (A. Tavkhelidze et. al. *J. Vac. Sci. Technol.* B, v. 25(4), p. 1270, 2007).

WO99/064642 discloses a method for fabricating nanostructures directly in a material film, preferably a metal film, deposited on a substrate.

WO04/040617 discloses a method that blocks movement of low energy electrons through a thermoelectric material. This is achieved using a filter that is more transparent to high-energy electrons than to low energy ones. A tunnel barrier on the path of the electrons is used as filter. The filter works on the basis of the wave properties of the electrons. The geometry of the tunnel barrier is such that the barrier becomes transparent for electrons having certain de Broglie wavelength. If the geometry of the barrier is such that its transparency wavelength matches the wavelength of high-energy electrons it will be transparent for high-energy electrons and will be blocking low energy ones by means of tunnel barrier.

U.S. Pat. No. 7,074,498 discloses the use of electrodes having a modified shape and a method of etching a patterned indent onto the surface of a modified electrode, which increases the Fermi energy level inside the modified electrode, leading to a decrease in electron work function. FIG. 1 shows the shape and dimensions of a modified electrode 66 having a thin metal film 68 on a substrate 62. Indent 64 has a width w and a depth Lx relative to the height of metal film 68. Film 68 comprises a metal whose surface should be as plane as possible as surface roughness leads to the scattering of de Broglie waves. Metal film 68 is given sharply defined geometric patterns or indent 64 of a dimension that creates a De Broglie wave interference pattern that leads to a decrease in the electron work function, thus facilitating the emissions of electrons from the surface and promoting the transfer of electrons across a potential barrier. The surface configuration of modified electrode 66 may resemble a corrugated pattern of squared-off, "u"-shaped ridges and/or valleys. Alternatively, the pattern may be a regular pattern of rectangular "plateaus" or "holes," where the pattern resembles a checkerboard. The walls of indent 64 should be substantially perpendicular to one another, and its edges should be substantially sharp. The surface configuration comprises a substantially plane slab of a material having on one surface one or more indents of a depth approximately 5 to 20 times a roughness of said surface and a width approximately 5 to 15 times said depth. The walls of the indents are substantially perpendicular to one another, and the edges of the indents are substantially sharp. Typically the depth of the indents is $\geq \lambda/2$, wherein $\lambda$ is the de Broglie wavelength, and the depth is greater than the surface roughness of the metal surface. Typically the width of the indents is $>>\lambda$, wherein $\lambda$ is the de Broglie wavelength. The purpose of the width being much larger than $\lambda$ is to prevent diffraction of the electron de Broglie wave. Typically the thickness of the slab is a multiple of the depth, preferably between 5 and 15 times said depth, and preferably in the range 15 to 75 nm.

BRIEF SUMMARY OF THE INVENTION

In accordance with the present invention, there is provided a quantum interference transistor comprising a thin metal film having a protrusion and a thin insulating layer between the metal film and protrusion. A voltage applied between the electrically isolated protrusion ("island") and the thin film leads to a change in the electron wave function of the island which in turn leads to a change in the Fermi level of the metal film in the entire region beneath the protrusion. Consequently, a potential barrier may or may not exist depending on the applied voltage, thus providing the present invention with the transistor-like property of switching between open and closed states.

Objects and advantages will become apparent from the following detailed description to be read in connection with the accompanying drawings.

BRIEF DESCRIPTION OF THE SEVERAL VIEWS OF THE DRAWING

For a more complete explanation of the present invention and the technical advantages thereof, reference is now made to the following description and the accompanying drawing in which.

DETAILED DESCRIPTION OF THE INVENTION

Figure 1:
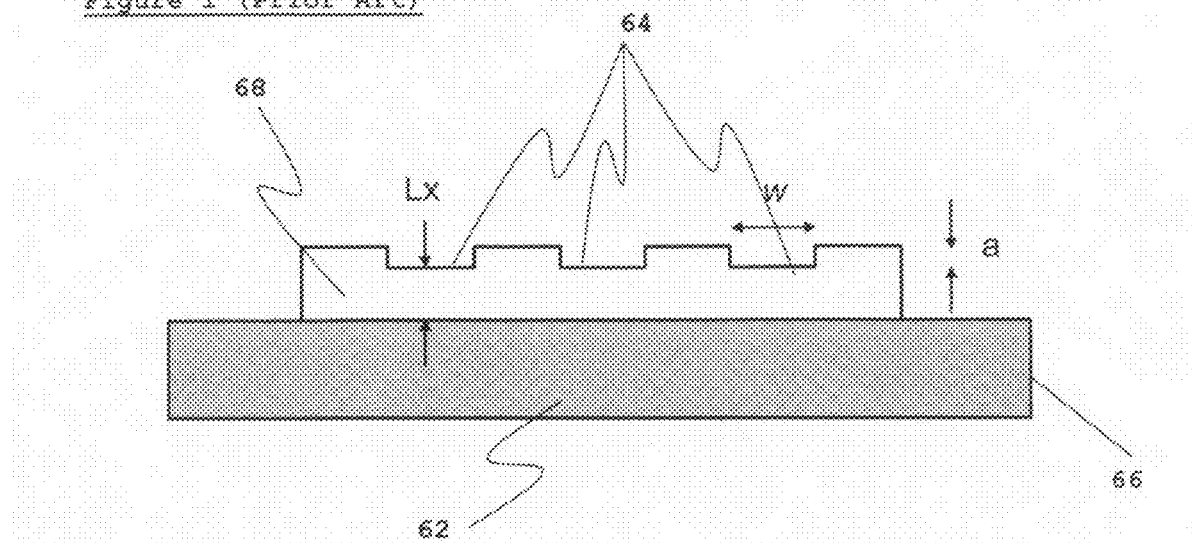
FIG. 1 shows a schematic of an indented surface of the prior art.
Figure 2:
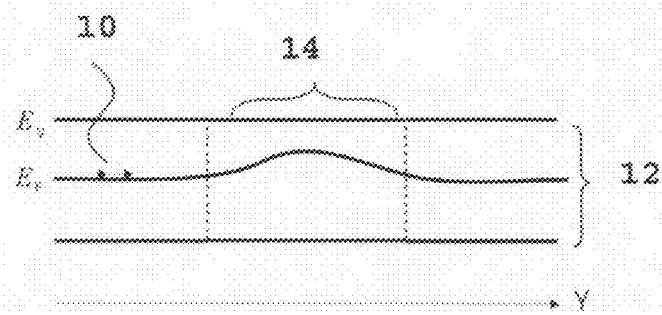
FIG. 2 shows a diagrammatic representation of an electron moving inside a metal film having a region of increased Fermi level.
Figure 3:
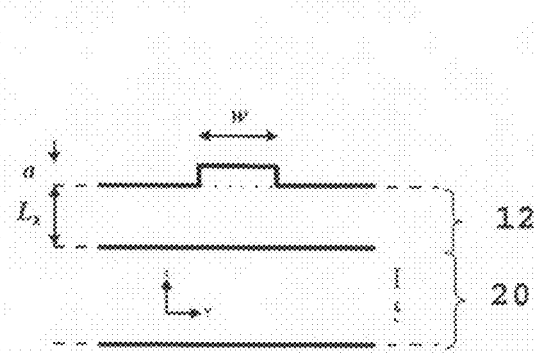
FIG. 3 shows a schematic of a thin metal film having a single protrusion.
Figure 4:
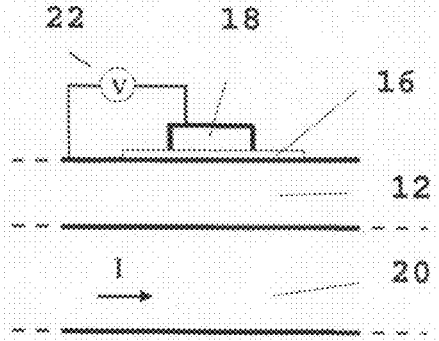
FIG. 4 shows a schematic of a device of the present invention.

Embodiments of the present invention and their technical advantages may be better understood by referring to FIGS. 2, 3, and 4.

As described in the prior art disclosed above, quantum interference effects lead to an increase in Fermi level, the magnitude of which depends on the geometry and has localized character. Referring now to FIG. 2, which shows electron 10 moving inside metal film 12, as the electron approaches the area with increased Fermi level 14 it will have to overcome the potential energy barrier to continue movement in the same direction.

Previously it had been shown that quantum interference effects appear because of a series of protrusions on the surface of a thin metal film. It has now been discovered that quantum interference also occurs on a single protrusion. Thus, referring to FIG. 3, which shows a thin metal film 12 of thickness $L_x$ on an insulator substrate 20, a single protrusion or island 18 of thickness a and width w is formed on its surface. Theoretical analysis has shown that the Fermi level increases in the quantum interference region according to the formula $$E_m = E_F[(L_x/a)(\sigma/w)]^{2/3}$$

where $E_m$ is the Fermi energy in protrusion area, $E_F$ is the Fermi energy in areas remote from the protrusion, $L_x$, a and w are dimensions as depicted in FIG. 3 and $\sigma$ is the mean free path of electron in a thin metal film.

Detailed analysis of the quantum interference of de Broglie waves, (including the perturbation method of solving Schrodinger equations) shows that in the case of $a/2L_x \ll 1$, the wave function of an electron, $\Psi$, is equal to zero along the line between the protrusion and the film (shown as a dotted line on FIG. 3).

Thus, if a thin insulator layer is introduced along the line denoted by the dotted line in FIG. 3, then, to a first approximation, the electron wave function distribution in the quantum interference area will not change. Preferably, the thickness of the insulator layer is less than the de Broglie wavelength for the electron.

Referring now to FIG. 4, a thin insulating layer 16 is disposed between thin metal film 12 and protrusion 18. The quantum interference effect still occurs in the protrusion area because insulating layer 16 is thin and the electron probability wave diffracts on it (the electron wave function tunnels through the insulating layer). Furthermore, insulating layer 16 is situated in the region where $\Psi=0$. The potential distribution along the film is thus identical to that depicted in FIG. 2. If an external voltage 22 is now applied between film 12 and electrically isolated protrusion ("island") 18, this alters the electron wave function inside island 18 relative to film 12. For example, if a positive potential is applied to island 18, wave number $k_i$ inside island 18 will increase. At the same time, the wave number inside the film $k_f$ remains unchanged because the film is considerably larger than the island. As a result of the requirement for wave functions and their derivatives to be equal on both sides of the barrier, the condition for wave function matching changes along the film/island border. According to analysis, these changes lead to a change in the Fermi level of the film in the entire region beneath island 18. Depending on the applied voltage, the Fermi level of this region will decrease and for some value of V, Fermi energy will be equal to $E_F$.

Thus the device depicted in FIG. 4, comprising a thin metal film and island isolated by a thin insulating layer is a new kind of transistor. Depending on the island voltage, a potential barrier created by quantum interference exists (at V=0) and does not exist (at V=Vc). When the potential barrier exists it is a case of a closed transistor and when no potential barrier exists it is a case of an open transistor (equivalent to the metal film).

While having described a specific preferred embodiment of the present invention with reference to the accompanied drawings, it is to be understood that the invention is not limited to that precise embodiment and that various changes and modifications may be effected therein by one skilled in the art without departing from the scope or spirit of the invention as defined in the appended claims.

The invention claimed is:

1. A quantum interference transistor comprising;
   (a) a thin metal film;
   (b) an island;
   (c) an insulating layer between said metal film and said island; and
   (d) an external voltage applied between said thin metal film and said island;
   wherein a potential barrier created by quantum interference exists in the metal film under the island when the external voltage is zero, and said potential barrier is reduced when a positive voltage is applied to the island, whereby flow of current in the film under the island is controlled.

2. The device of claim 1, further comprising an insulating substrate.

3. The device of claim 1, wherein said insulating layer has a thickness that is less than a de Broglie wavelength.

4. The device of claim 1, wherein walls of said island are substantially perpendicular to one another.

5. The device of claim 1, in which edges of said island are substantially sharp.

6. The device of claim 1, wherein a depth of said island $\geq \lambda/2$, wherein $\lambda$ is the de Broglie wavelength.

7. The device of claim 1, wherein a depth of said island is greater than the surface roughness of the metal surface.

8. The device of claim 1, wherein a width of said island $\gg \lambda$, wherein $\lambda$ is the de Broglie wavelength.

9. The device of claim 1 wherein a thickness of said metal film is between 5 and 15 times a depth of said island.

10. The device of claim 1 wherein a thickness of said metal film is in the range 15 to 75 nm.

11. The device of claim 1 wherein said voltage changes the electron wave function inside said electrically isolated island relative to said thin metal film such that said change leads to a change in the Fermi level of said film in the region below said island.

12. The device of claim 1 in which said metal film does not comprise a superconducting material.

* * * * *